(12) United States Patent
    Leobandung

(10) Patent No.: US 9,601,385 B1
(45) Date of Patent: Mar. 21, 2017

(54) METHOD OF MAKING A DUAL STRAINED CHANNEL SEMICONDUCTOR DEVICE

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/007,970

(22) Filed: Jan. 27, 2016

(51) Int. Cl.
| H01L 29/78 | (2006.01) |
| H01L 29/772 | (2006.01) |
| H01L 27/12 | (2006.01) |
| H01L 21/8238 | (2006.01) |
| H01L 21/033 | (2006.01) |
| H01L 29/161 | (2006.01) |
| H01L 29/165 | (2006.01) |
| H01L 29/66 | (2006.01) |

(52) U.S. Cl.
CPC ........... *H01L 21/823814* (2013.01); *H01L 21/823821* (2013.01); *H01L 21/823878* (2013.01); *H01L 29/161* (2013.01); *H01L 29/165* (2013.01); *H01L 29/66636* (2013.01); *H01L 29/7848* (2013.01)

(58) Field of Classification Search
CPC ......... H01L 21/823821; H01L 27/1104; H01L 21/845
USPC ............... 257/351, 410; 438/218, 427, 432
See application file for complete search history.

(56) References Cited

U.S. PATENT DOCUMENTS

| 6,963,078 | B2 | 11/2005 | Chu |
| 7,091,095 | B2 | 8/2006 | Chu |
| 7,282,402 | B2 | 10/2007 | Sadaka et al. |
| 7,462,549 | B2 | 12/2008 | Xiang et al. |
| 7,518,193 | B2 | 4/2009 | Anderson et al. |
| 2005/0260807 | A1* | 11/2005 | Orlowski ............ H01L 29/0847 438/197 |
| 2006/0157794 | A1* | 7/2006 | Doyle ............... H01L 29/66795 257/368 |
| 2008/0213952 | A1 | 9/2008 | Xiang et al. |
| 2011/0291188 | A1* | 12/2011 | Cheng ................... H01L 29/785 257/347 |
| 2012/0080722 | A1 | 4/2012 | Yin et al. |
| 2012/0098067 | A1* | 4/2012 | Yin ................... H01L 21/76254 257/351 |
| 2012/0161243 | A1* | 6/2012 | Kronholz .......... H01L 21/31116 257/369 |
| 2013/0196508 | A1* | 8/2013 | LiCausi .......... H01L 21/823821 438/696 |

(Continued)

*Primary Examiner* — Kimberly Rizkallah
*Assistant Examiner* — Brian Turner
(74) *Attorney, Agent, or Firm* — Scully, Scott, Murphy & Presser, P.C.; Louis J. Percello, Esq.

(57) ABSTRACT

A method of forming a semiconductor device includes forming on a substrate mandrels made from a semiconductor material. A semiconductor material having a lattice constant that is different than the mandrel semiconductor material is deposited onto sidewalls of the mandrels to form strained semiconductor layers. The mandrels are at least partially removed to form free-standing or partially-supported fins that include the strained semiconductor layers. The strained semiconductor layers may include tensile silicon or compressive silicon germanium, which can be used to form a dual strained channel semiconductor device.

16 Claims, 4 Drawing Sheets

(56) References Cited

U.S. PATENT DOCUMENTS

| | | | | |
|---|---|---|---|---|
| 2014/0004708 A1* | 1/2014 | Thedjoisworo | ...... | H01L 21/3065 438/723 |
| 2014/0151766 A1 | 6/2014 | Eneman et al. | | |
| 2014/0264601 A1* | 9/2014 | Basker | ................ | H01L 29/1054 257/347 |
| 2014/0287569 A1* | 9/2014 | Mori | ................... | H01L 21/3065 438/478 |
| 2014/0357034 A1* | 12/2014 | Cheng | ................... | H01L 29/785 438/275 |

\* cited by examiner

METHOD OF MAKING A DUAL STRAINED CHANNEL SEMICONDUCTOR DEVICE

BACKGROUND

The present application relates generally to semiconductor devices, and more specifically to dual strained channel devices and their methods of manufacture.

The integration of p-type metal oxide semiconductor (PMOS) logic with n-type metal oxide semiconductor (NMOS) logic on a single substrate poses a number of processing challenges, including the enhancement of disparate channel regions (e.g., a p-type channel that comprises compressively strained SiGe and an n-type channel that comprises tensile Si) as well as the accommodation of typical trench isolation modules, which introduce a thermal budget that can adversely affect performance of the channel materials.

A number of methods have been used to form integrated CMOS devices, including strain relaxed buffers to form semiconductor layers such as SiGe. May of these methods present several disadvantages, however, including long deposition times, rough surfaces, non-uniform stress, high residual strain, and high defect densities including high threading dislocation densities.

Accordingly, it would be advantageous to provide semiconductor device manufacturing methods that enable the integration of PMOS and NMOS structures while overcoming the challenges faced by the industry.

SUMMARY

In accordance with embodiments of the present application, a method of forming a semiconductor device includes forming a plurality of mandrels on a substrate, and depositing onto a pair of opposing sidewalls of the mandrels a semiconductor material to form strained semiconductor material layers on the opposing sidewalls. A first semiconductor material can be deposited onto the mandrels within a first region of the substrate and a second semiconductor material can be deposited onto the mandrels within a second region of the substrate. The semiconductor material layers may be formed from semiconductor materials having a lattice constant that is greater than or less than the lattice constant of a semiconductor material used to form the mandrels. In embodiments, the semiconductor material layers may be tensile or compressive and can define a channel region of a dual strained channel device.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Electron and hole mobility in strained Si and SiGe layers have been shown to be significantly higher than in bulk, unstrained layers, and metal oxide semiconductor field effect transistors (MOSFETs) with strained Si and/or SiGe channels have been experimentally demonstrated to exhibit enhanced device performance compared to devices fabricated in conventional (unstrained) silicon or silicon germanium substrates. Potential performance improvements include increased device drive current and transconductance, as well as the ability to scale the operational voltage without sacrificing circuit speed, in order to reduce power consumption.

Embodiments of the present application relate to integrating bi-axially tensile Si and bi-axially compressive SiGe with suitable isolation for achieving an NMOS and PMOS device performance enhancement. The magnitude of tension and compression in the respective channel materials may independently range from 100 MPa to 5 GPa, e.g., 100, 200, 500, 1000, 2000 or 5000 MPa, including ranges between any of the foregoing values.

In embodiments, channel regions for dual channel CMOS architectures are formed as isolated and raised fins that respectively comprise tensile silicon (Si) and compressive silicon germanium (SiGe). The fins are formed by selective epitaxial deposition onto the sidewalls of provisional mandrel structures. Methods for forming integrated dual strained channel CMOS architectures are described below with particular reference to FIGS. 1-7.

Figure 1:
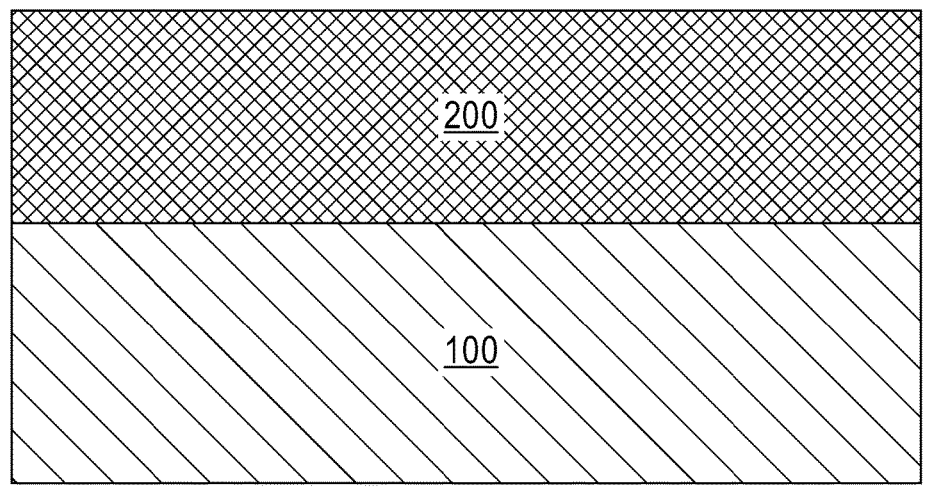
FIG. 1 is a schematic diagram of a semiconductor substrate including a strained SiGe layer used to form a device architecture according to one embodiment.

Shown in FIG. 1 is a semiconductor substrate 100 including a layer 200 of compressively strained silicon germanium (SiGe) formed on an upper surface thereof. Substrate 100 may be a semiconductor material such as silicon or a silicon-containing material. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire sample is substantially continuous and substantially unbroken to the edges of the sample with substantially no grain boundaries.

Substrate 100 is not limited to silicon-containing materials, as the substrate 100 may comprise other semiconductor materials, including Ge and compound semiconductors such as III-V semiconductor materials, or II-VI semiconductor materials. In embodiments, substrate 100 may comprise a bulk substrate or a layered semiconductor such as Si/SiGe or a preformed silicon-on-insulator (SOI) or SiGe-on-insulator (SGOI) substrate.

In embodiments, the strained silicon germanium layer 200 is a compressive, hetero-epitaxial layer formed directly on an upper surface of the substrate 100. The strained silicon germanium layer 200 may be formed by chemical vapor deposition, such as metalorganic chemical vapor deposition (MOCVD) or metalorganic vapor phase epitaxy (MOVPE) from gaseous precursors such as silane ($SiH_4$) or dichlorosilane ($SiH_2Cl_2$) and $GeH_4$. Deposition of the silicon germanium layer 200 may be performed at a constant temperature between 300° C. and 550° C. The silicon germanium layer 200 may include 25 to 50 atomic percent germanium and may have a thickness of 30 to 100 nm.

Figure 2:
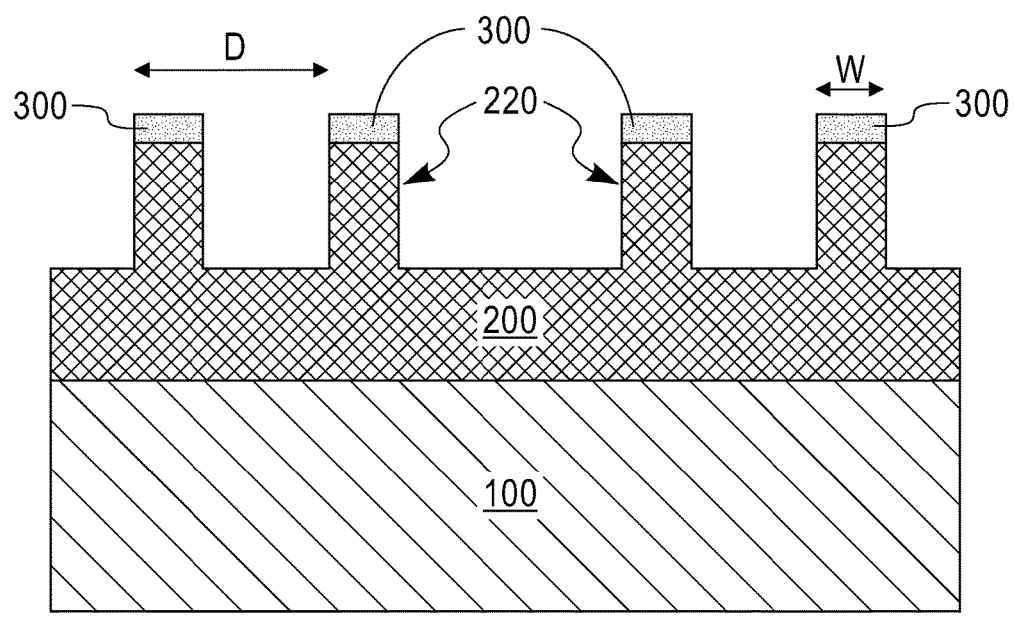
FIG. 2 shows patterning of the SiGe layer of FIG. 1 to form a plurality of mandrels each having a hard mask layer formed thereon.

As shown in FIG. 2, a hard mask layer 300 is deposited over a surface of the strained silicon germanium layer 200, for example, by chemical vapor deposition (CVD). The hard mask layer 300 can include one or more layers that can be used as an etch mask for defining mandrels 220 within an upper portion of the silicon germanium layer 200. In embodiments, the hard mask layer 300 can include a dielectric material such as a doped or undoped silicon oxide, silicon nitride, silicon oxynitride, a dielectric metal nitride, or a dielectric metal oxide. In embodiments, the hard mask layer 300 is a nitride. The thickness of the hard mask layer 300 can be from 5 to 20 nm, e.g., 10 nm, although lesser and greater thicknesses can be used.

A photoresist layer (not shown) can be applied over the hard mask layer, and can be lithographically patterned to form openings corresponding to areas of openings to be subsequently formed in the hard mask layer 300. Thus, as known to those skilled in the art, the pattern in the photoresist layer can be transferred into the hard mask layer 300.

The pattern in the hard mask layer 300 can, in turn, be transferred into the strained silicon germanium layer 200 by an isotropic or anisotropic etch that uses the hard mask layer 300 as an etch mask, resulting in the formation of mandrels 220 that extend upward and away from the substrate 100. After forming the mandrels 220, the photoresist can be removed by ashing, or can be consumed during the etch process that defines the mandrels 220.

As depicted in FIGS. 1-5, the substrate 100 may include an array of mandrels 220. The mandrel array is designed to have a pitch D and a width W that are appropriate to form the desired device architecture, where pitch is defined as the distance between identical features in the array. According to various embodiments, the pitch and width of the mandrel array can be chosen such that the facing sidewalls of a pair of adjacent mandrels are separated from each other by a distance on the order of the width of a mandrel, e.g., from D≈W to D≈2 W. By way of example, the pitch D can vary from 20 nm to 200 nm and the mandrel width W can vary from 10 nm to 100 nm.

In embodiments, the height of the mandrels 220, as measured from a bottommost surface of each mandrel 220 to a topmost surface of each mandrel 220, can be 40 to 90 nm. In embodiments, the height of respective ones of a plurality of mandrels 220 is constant or substantially constant, i.e., varies by less than 2% over a mandrel array. As a result of the mandrel-defining etch, the silicon germanium layer 200, including the silicon germanium material within the mandrels 220, may elastically relax from a compressive state to a neutral or substantially neutral stress state. As used herein, the absolute value of the magnitude of stress of an element having a substantially neutral stress state is less than 100 MPa, e.g., 0, 50 or 100 MPa.

Figure 3:
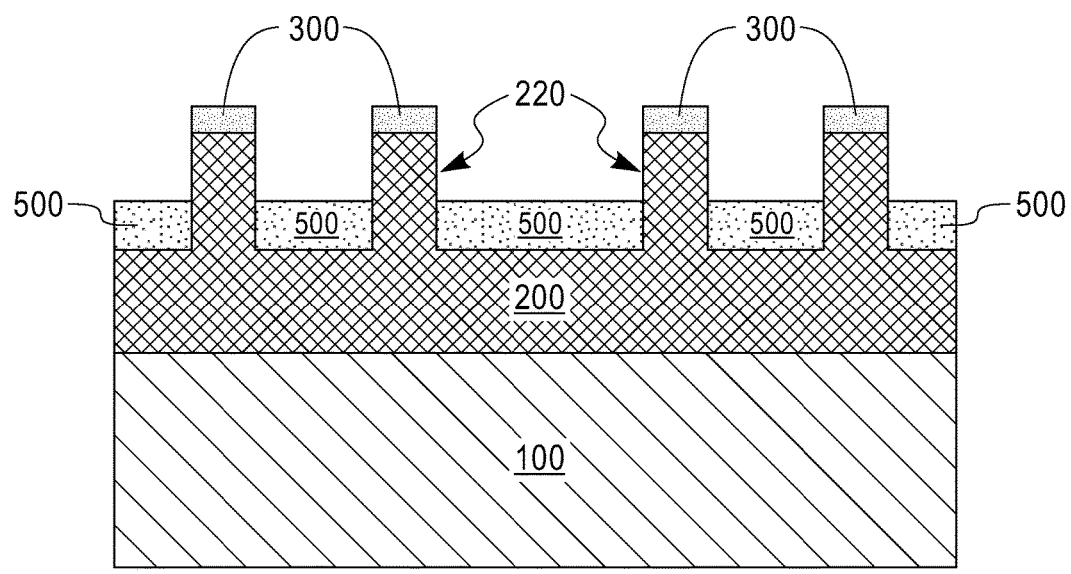
FIG. 3 shows the deposition and planarization of an isolation layer over the substrate and between the mandrels.

With reference to FIG. 3, an isolation layer 500 is deposited over exposed surfaces of the structure of FIG. 2 and recessed such that the height of the isolation layer 500 is less than the height of the mandrels. According to embodiments, isolation layer 500 comprises an oxide, nitride, oxynitride or any combination thereof. Illustrative examples of materials that can be used as an isolation layer 500 include, but are not limited to, silicon oxide ($SiO_2$), silicon nitride (SiN), aluminum oxide ($Al_2O_3$), silicon oxynitride, hafnium oxide ($HfO_2$), zirconium oxide ($ZrO_2$) and doped aluminum oxide. In embodiments, the isolation layer 500 comprises an oxide and the hard mask 300 comprises a nitride. The height of isolation layer 500 is typically 10 to 40 nm, e.g., 10, 20, 30 or 40 nm, including ranges between any of the foregoing values, though lesser and greater thicknesses may be used.

The isolation layer 500 is formed on a surface of silicon germanium layer 200 using a conventional deposition process such as, for example, CVD, PECVD, evaporation, chemical solution deposition, atomic layer deposition and the like, and an etch back process including an isotropic or anisotropic etch as known to those skilled in the art can follow the deposition process. The isolation layer 500 covers a lower portion of each mandrel 220 as well as an exposed topmost surface of the silicon germanium layer 200 that remains after mandrel 220 formation.

Figure 4:
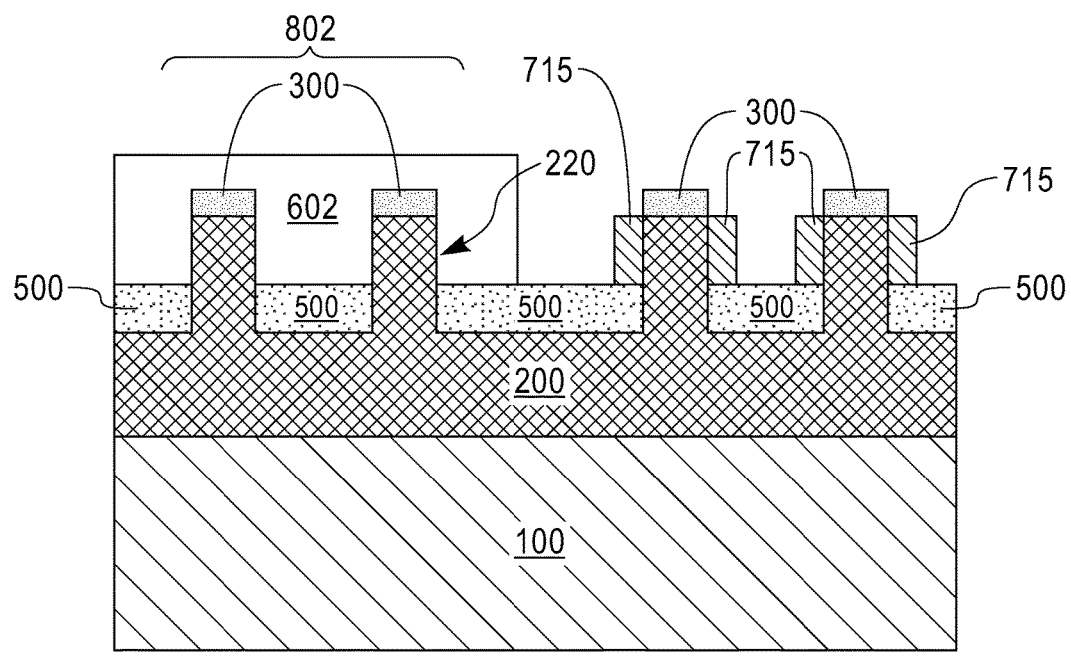
FIG. 4 illustrates the deposition of a masking layer over one portion of the substrate and the deposition by selective epitaxy of a first semiconductor material over sidewalls of the unmasked mandrels.

Next, as shown in FIG. 4, a mask 602 is formed over a first region 802 of the structure depicted in FIG. 3. The mask 602 covers one or more mandrels 220 within the first region 802. Mask 602 may comprise any material suitable for preventing deposition of a semiconductor material directly onto the mandrels within the first region 802, and which can be later removed with selectivity to both the hard mask layer 300 and the isolation layer 500.

In a subsequent step, and referring still to FIG. 4, a selective epitaxial process is performed to deposit a first semiconductor material 715 onto the physically exposed sidewalls of mandrels 220 located outside of the first region 802. Hard mask 300 prevents deposition of the first semiconductor material onto the top surfaces of the mandrels. The thickness of the first semiconductor material 715 (i.e., with respect to the surface of the mandrel 220) may be 2 to 50 nm, e.g., 2, 5, 10, 20 or 50 nm, including ranges between any of the foregoing values, though lesser and greater thicknesses can also be used. The height of the first semiconductor material 715 (i.e., with respect to the isolation layer 500) may be 10 to 50 nm, e.g., 10, 20, 30, 40 or 50 nm, including ranges between any of the foregoing values, though lesser and greater heights can also be used.

Epitaxial deposition may be carried out using a molecular beam epitaxy (MBE) process, an e-beam process, an MOCVD process, an MOVPE process, or a pulsed laser deposition (PLD) process. The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation.

In embodiments, the first semiconductor material 715 is silicon (Si), which can be deposited using a gaseous precursor such as silane (SiH$_4$). Epitaxial growth of Si on the SiGe mandrel will yield a Si layer under tensile strain, with the underlying SiGe mandrel being essentially unstrained, or "relaxed." Strained Si layers 715 are the result of biaxial tensile stress induced in silicon grown on a mandrel formed from a material whose lattice constant is greater than that of silicon. The lattice constant of germanium is about 4.2 percent greater than that of silicon, and the lattice constant of a SiGe alloy is proportional to its germanium content. Without wishing to be bound by theory, the lattice constant, a, of a Si$_{1-x}$Ge$_x$ alloy at 300K can be represented as a(x)=5.431+0.2x+0.027x$^2$ Angstroms, where x is germanium content in the alloy. By way of example, the lattice constant of a SiGe alloy (mandrel structure) containing 50 atomic percent germanium is about 1.02 times greater than the lattice constant of silicon.

Figure 5:
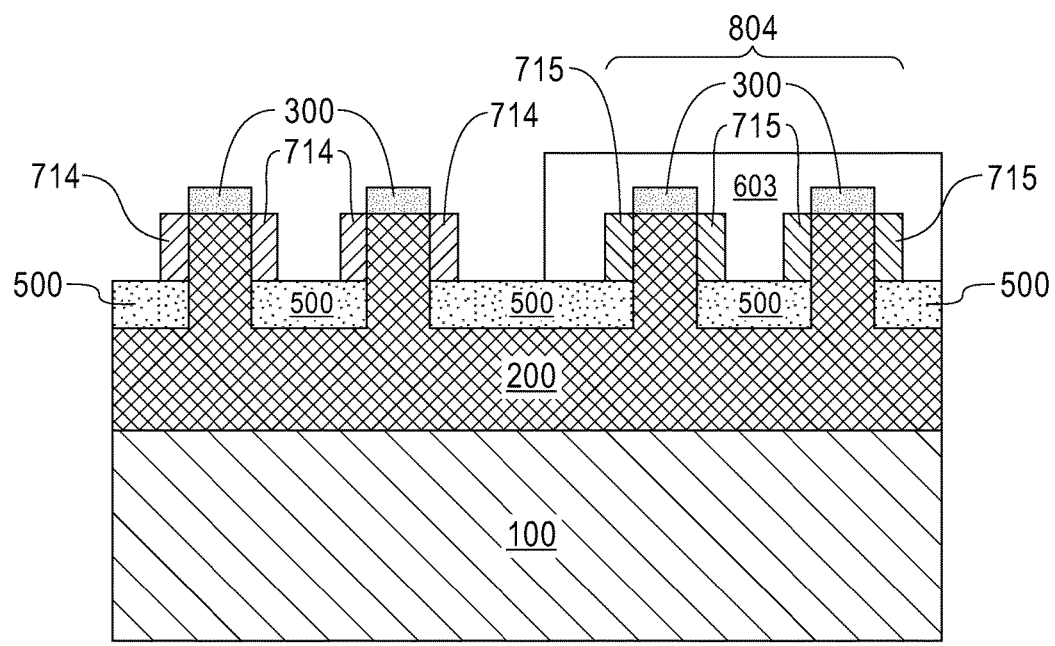
FIG. 5 illustrates the deposition of a masking layer over a further (second) portion of the substrate and the deposition by selective epitaxy of a second semiconductor material over sidewalls of the unmasked mandrels.

Turning to FIG. 5, the mask 602 within the first region 802 is removed and a further (second) mask 603 within a second region 804 is deposited to cover one or more mandrels 220 as well as strained Si layers 715 within the second region. As discussed above, mask 603 is adapted to prevent deposition of a semiconductor material directly onto the mandrels within the second region 803.

A selective epitaxy process is then performed to deposit a second semiconductor material 714 onto the physically exposed sidewalls of mandrels 220 located within the first region 802. Hard mask 300 prevents deposition of the first semiconductor material onto the top surfaces of the mandrels 220. The thickness of the second semiconductor material 714 (i.e., with respect to the surface of the mandrel 220) may be 2 to 50 nm, e.g., 2, 5, 10, 20 or 50 nm, including ranges between any of the foregoing values, although lesser and greater thicknesses can also be used. The height of the first semiconductor material 714 (i.e., with respect to the isolation layer 500) may be 10 to 50 nm, e.g., 10, 20, 30, 40 or 50 nm, including ranges between any of the foregoing values, although lesser and greater heights can also be used.

In embodiments, the second semiconductor material 714 is silicon germanium (SiGe). Epitaxial growth of SiGe on the SiGe mandrel will yield a SiGe layer under compressive strain, with the underlying SiGe mandrel being essentially unstrained, or "relaxed." Strained SiGe layers 714 are the result of a biaxial compressive stress induced in silicon germanium grown on a mandrel formed from a material whose lattice constant is less than that of the SiGe layers 714, which is due to the germanium content of the SiGe layers 714 being greater than the germanium content in the mandrel. In embodiments, the germanium content of the SiGe layers 714 is 50 to 75 atomic percent germanium (balance silicon).

While in the process described above, the deposition of tensile silicon layers 715 on mandrel structure sidewalls within a second region 804 precedes the deposition of compressive silicon germanium layers 714 on mandrel structure sidewalls within a first region 802, it will be appreciated that deposition of the compressive silicon germanium layers 714 may occur before deposition of the tensile silicon layers 715 to form a dual channel CMOS architecture or, in alternative embodiments, either one of the compressive silicon germanium layers and the tensile silicon layers may be omitted to form an n-FET or a p-FET device architecture, respectively.

The first and second semiconductor materials layers 714, 715 may be intrinsic or doped p-type or n-type. As used herein, "p-type" refers to the addition of impurities to an intrinsic semiconductor that creates a deficiency of valence electrons. For silicon and silicon germanium, example p-type dopants, i.e., impurities, include but are not limited to, boron, aluminum and gallium. As used herein, "n-type" refers to the addition of impurities that contribute free electrons to an intrinsic semiconductor. For silicon and silicon germanium, example n-type dopants, i.e., impurities, include but are not limited to, phosphorus, arsenic and antimony. The dopant(s) may be introduced by ion implantation or may be introduced, for example, in situ, i.e., during a process sequence used to form the layer.

Figure 6:
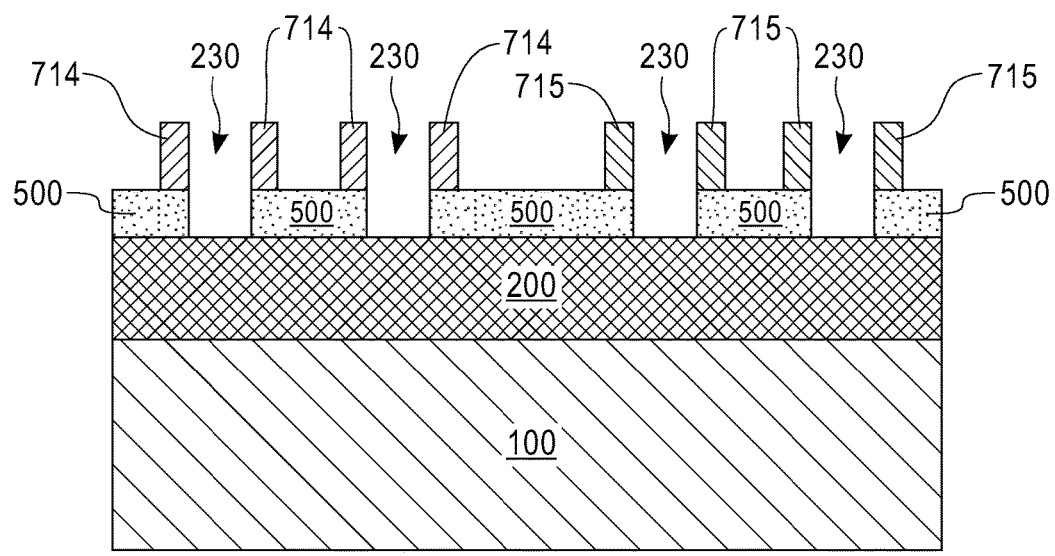
FIG. 6 depicts an intermediate architecture including a plurality of first and second semiconductor fins after removal of the mandrels.

As seen with reference to FIG. 6, with the removal of all or a portion of the mandrels 220 and overlying hard mask 300, free-standing or partially-supported fins 716, 717 are formed from the first and second semiconductor materials layers 714, 715. In embodiments, the removal of mandrels 220 does not affect the strain state of first and second semiconductor materials layers 714, 715. For instance, prior to removal of the mandrels 220, first and second semiconductor materials layers 714, 715 may be annealed and/or partially-supported (i.e., anchored). The hard mask 300 and the mandrels 220 can be removed, for example, by a wet etch selective to the semiconductor materials layers 714, 715 and the isolation layer 500 to form recesses 230 between adjacent fins. In one embodiment, the hard mask 300 can include silicon nitride and the isolation layer 500 can include silicon oxide, and the removal of the hard mask 300 and the mandrel structure 220 can be carried out by a wet etch comprising, for example, hot phosphoric acid. In embodiments, partially-supported fins 716, 717 may be anchored to un-removed mandrels, for example, along one or both of the opposing endwalls of each fin.

Figure 7:
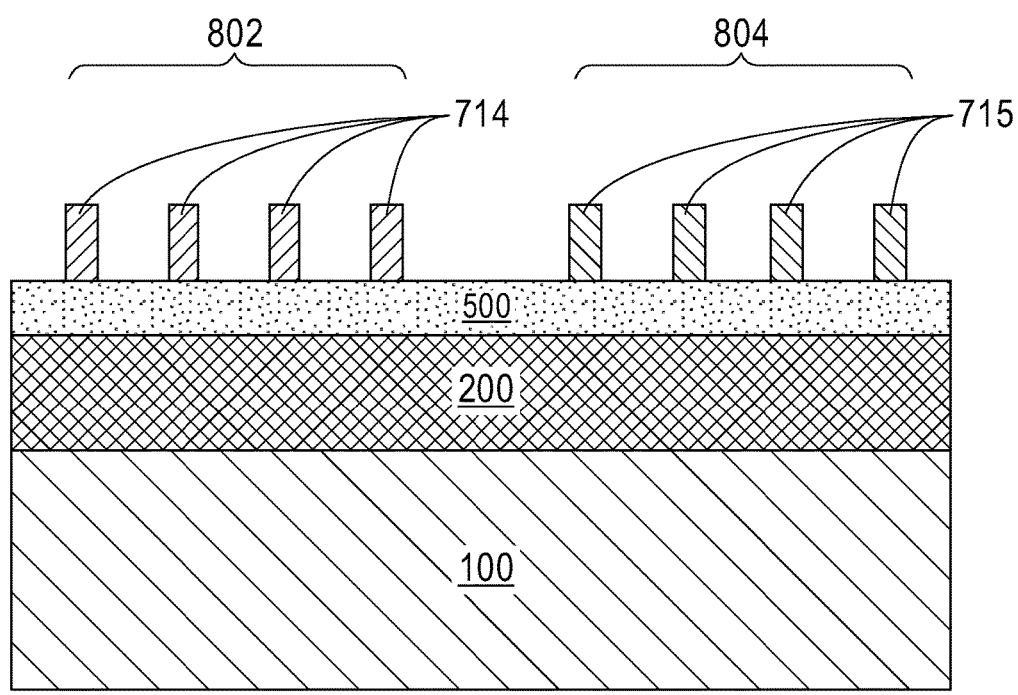
FIG. 7 shows a device architecture following deposition and planarization of an isolation layer within recesses formed by removal of the mandrels.

As shown in FIG. 7, recesses 230 formed by removal of the mandrels can be backfilled and planarized with a dielectric material. The material used to fill recesses 230 can be the same as, or different from, the material used to form isolation layer 500. In the illustrated embodiment, the material that fills the recesses 230 is the same as that which provides isolation layer 500.

As used herein, a "fin" or a "semiconductor fin" refers to a semiconductor material element having a pair of substantially parallel and vertical sidewalls that are laterally spaced by a uniform dimension. In one embodiment, each semiconductor fin 716, 717 can have a rectangular horizontal cross-sectional area such that the spacing between the pair of parallel vertical sidewalls is the same as the length of shorter sides of the shape of the rectangular horizontal cross-sectional area.

As is known to those skilled in the art, the fin architecture described above may be additionally processed to form a gate stack (including a gate dielectric portion and a gate electrode portion), an optional spacer structure, as well as source and drain regions to produce a dual channel CMOS architecture comprising, for example, a four channel p-FET within first region 802 and a four channel n-FET within second region 804.

A fin field effect transistor (FinFET) is a type of multi-gate device where the channel is formed as a vertical fin. Multiple gates are formed over and along the sidewalls of the fin. A FinFET enables a range of channel lengths and provides a broad process window for gate structures. FinFET devices typically include high aspect-ratio semiconductor fins in which the channel and source/drain regions for the transistor are formed. The increased surface area of the channel and source/drain regions results in fast, reliable and better-controlled semiconductor transistor devices.

Fin field effect transistors (FinFETs) made using the methods described herein include a substantially rectangular fin structure that is formed over an isolation layer by depositing a semiconductor material onto the sidewalls of a sacrificial mandrel According to embodiments, fins are formed without the use of spacer structures on the mandrel sidewalls, which is in contrast to several conventional methods where fins are formed by etching a blanket layer of semiconductor material using a mandrel or spacer structure as an etch mask to define the fin structure. Thus, the instant method of forming fins 716, 717 may be regarded as additive rather than subtractive.

Each semiconductor fin 716, 717 is laterally defined by a pair of lengthwise sidewalls and a pair of widthwise sidewalls. As used herein, a "lengthwise direction" of an element refers to a direction about which the moment of inertia of the element becomes a minimum, and a "lengthwise sidewall" of an element refers to a sidewall of an element that extends along the lengthwise direction of the element. Further, a "widthwise sidewall" of an element refers to a sidewall of the element that extends along a horizontal direction that is perpendicular to the lengthwise direction of the element. The height of the semiconductor fins 716, 717 can be from 30 nm to 50 nm, although lesser and greater heights can also be used.

In embodiments, lengthwise sidewalls of multiple semiconductor fins 716, 717 within a same row can be within a pair of vertical planes laterally spaced from each other by the width of a semiconductor fin 716, 717. In embodiments, widthwise sidewalls of multiple semiconductor fins within a same column can be within a pair of vertical planes laterally spaced from each other by the length of a semiconductor fin 716, 717. In embodiments, the plurality of semiconductor fins 716, 717 can be within a two-dimensional array having a first pitch along the lengthwise direction of the semiconductor fins 716, 717 and a second pitch along the lengthwise direction of the semiconductor fins.

Embodiments of the present application provide methods for integrating NMOS and PMOS functionality while taking advantage of the performance enhancements derived from tensile Si and compressive SiGe. In various embodiments, an isolation module is performed prior to selective epitaxy of the strained silicon and silicon germanium fins, thus avoiding exposure of the channel regions to high temperatures, which may induce, for example, unwanted diffusion of germanium.

With respect to various embodiments, a dual channel approach with tensile silicon and compressive silicon germanium provides a combined advantage for enhanced carrier mobility. For example, enhanced carrier mobility of at least 50% for NMOS and at least 25% for PMOS can be achieved. Additional advantages with respect to conventional approaches, such as strained Si on bulk, include increased speed and/or reduced power consumption. For example, the presently-disclosed dual channel structures can provide at least a 10% increase in speed at a same standby power compared to strained Si alone. In addition, the disclosed methods allow for the optimization of one channel without affecting the other.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a semiconductor fin that comprises silicon germanium (SiGe) include embodiments where a fin consists essentially of silicon germanium and embodiments where a fin consists of silicon germanium.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A method of forming a semiconductor device comprising:
    providing a material stack comprising, from bottom to top, a semiconductor substrate and a base semiconductor layer of a strained semiconductor material;
    forming a plurality of mandrels by etching an upper portion of the base semiconductor layer, wherein the mandrels are located on a remaining unetched portion of the base semiconductor layer, and wherein each mandrel and the remaining unetched portion of the semiconductor base layer comprise a semiconductor material that is relaxed relative to the strained semiconductor material of the base semiconductor layer prior to the etching;
    depositing a first semiconductor material directly on a pair of opposing semiconductor sidewalls of the mandrels and within a first region of the semiconductor substrate to form first strained semiconductor material layers directly on the opposing semiconductor sidewalls of the mandrels within the first region; and
    removing the mandrels to form semiconductor fins comprising the first strained semiconductor material layers.

2. The method of claim 1, wherein the first strained semiconductor material layers comprise tensile silicon.

3. The method of claim 1, wherein the first strained semiconductor material layers comprise compressive silicon germanium.

4. The method of claim 1, further comprising
    depositing a second semiconductor material directly on a pair of opposing semiconductor sidewalls of the mandrels within a second region of the semiconductor substrate to form second strained semiconductor material layers directly on the opposing semiconductor sidewalls within the second region, wherein the first strained semiconductor material layers are tensile and the second strained semiconductor material layers are compressive.

5. The method of claim 4, wherein the first strained semiconductor material layers comprise silicon and the second strained semiconductor material layers comprise silicon germanium.

6. The method of claim 5, wherein the silicon germanium comprises 50 to 75 atomic percent germanium.

7. The method of claim 4, wherein the removing the mandrels in the second region provides semiconductor fins comprising the second strained semiconductor material layers.

8. The method of claim 1, wherein the strained semiconductor material of the base semiconductor layer comprises silicon germanium having 25 to 50 atomic percent germanium.

9. The method of claim 1, further comprising depositing a dielectric layer on the remaining unetched portion of the base semiconductor layer prior to depositing the first semiconductor material.

10. The method of claim 1, further comprising depositing a hard mask on a top surface of the base semiconductor layer prior to forming the mandrels.

11. The method of claim 1, further comprising depositing a hard mask on a top surface of the base semiconductor layer prior to the forming the mandrels.

12. A method of forming a semiconductor device comprising:
providing a material stack comprising, from bottom to top, a semiconductor substrate and a base semiconductor layer of a strained semiconductor material;
forming a plurality of mandrels by etching into an upper portion of the base semiconductor layer, wherein each mandrel is present on an unetched portion of the base semiconductor layer, and wherein each mandrel and the remaining unetched portion of the semiconductor base layer comprise a semiconductor material that is relaxed relative to the strained semiconductor material of the base semiconductor layer prior to the etching;
depositing a first semiconductor material directly on a pair of opposing semiconductor sidewalls of each of the mandrels within a first region of the semiconductor substrate to form first strained semiconductor material layers directly on the opposing semiconductor sidewalls of each of the mandrels within the first region;
depositing a second semiconductor material directly on a pair of opposing semiconductor sidewalls of each of the mandrels within a second region of the semiconductor substrate to form second strained semiconductor material layers directly on the opposing semiconductor sidewalls of each of the mandrels within the second region; and
removing the mandrels to form semiconductor fins comprising the first and second strained semiconductor material layers.

13. The method of claim 12, wherein the first strained semiconductor material layers comprise tensile silicon and the second strained semiconductor material layers comprise compressive silicon germanium.

14. The method of claim 12, wherein the second strained semiconductor material layers comprise 50 to 75 atomic percent germanium.

15. The method of claim 12, wherein the mandrels comprise silicon germanium having 25 to 50 atomic percent germanium.

16. The method of claim 12, further comprising depositing a dielectric layer within a gap located between each of the mandrels prior to depositing the first and second semiconductor materials.

* * * * *